United States Patent [19]

Masuda

[11] Patent Number: 4,541,848
[45] Date of Patent: Sep. 17, 1985

[54] PULSE POWER SUPPLY FOR GENERATING EXTREMELY SHORT PULSE HIGH VOLTAGES

[76] Inventor: Senichi Masuda, No. 605, Nishigahara 1-40-10, Kita-ku, Tokyo-to, Japan

[21] Appl. No.: 415,364

[22] Filed: Sep. 7, 1982

[30] Foreign Application Priority Data

Sep. 12, 1981 [JP] Japan ................................ 56-144399

[51] Int. Cl.$^4$ .............................................. B03C 3/66
[52] U.S. Cl. ........................................ 55/139; 361/235
[58] Field of Search ............ 361/235; 315/208, 200 R, 315/209 CD, 272, 273, 268, 357; 55/139

[56] References Cited

U.S. PATENT DOCUMENTS

| | | | |
|---|---|---|---|
| 2,414,363 | 1/1947 | Dietert et al. | 315/200 R |
| 3,019,371 | 1/1962 | Bardocz | 315/208 X |
| 3,271,623 | 9/1966 | Dyer, Jr. et al. | 315/357 |
| 4,138,233 | 2/1979 | Masuda | 361/235 X |
| 4,210,949 | 7/1980 | Masuda | 361/235 X |

*Primary Examiner*—Harry E. Moose, Jr.
*Attorney, Agent, or Firm*—Price, Heneveld, Huizenga & Cooper

[57] ABSTRACT

A pulse power supply for generating extremely short pulse high voltages comprizing an ac charging high voltage, rectifier, pulse forming unit as a capacitive energy storage element, and an externally-controlled high speed synchronous switching unit, such as a mechanical synchronous spark switch of rotating type. The capacitive energy storage element, i.e. condenser is charged up by the ac charging high voltage source from zero voltage to its peak voltage through the rectifier without the use of current limiting resistance during its half cycle or desired polarity, i.e. negative one. Then, this charged potential of the capacitive element is kept, with the blocking action of the rectifier, until a desired instant of the next half cycle when the said switching unit is triggered from outside, e.g. by rotation of the rotor disc carrying the spark electrode elements, and the very short pulse high voltages are produced at this instant at the output of this pulse power supply. This charging scheme by an ac charging voltage altering from zero to its peak reduces greatly the power loss in the charging process of the capacitive element. The switching of the charged capacitive element to the load in the next half cycle when the rectifier is blocking avoid the short-circuit current to flow from the arc charging voltage source to the load, making the production of the pulse voltage stable and use of a large protective resistance unecessary.

7 Claims, 7 Drawing Figures

PULSE POWER SUPPLY FOR GENERATING EXTREMELY SHORT PULSE HIGH VOLTAGES

BACKGROUND OF THE INVENTION

The present invention relates to an economical and high-performance pulse power supply for generating extremely short pulse high voltages to be applied in various kinds of devices utilizing pulse high voltages, including a pulse-energized electrostatic precipitator, a Boxer-Charger for providing charge to dust particles, a pulse-energized ozonizer generating ozone by pulse corona, etc.

The inventor of the present invention succeeded in improving the collection performance of an electrostatic precipitator by proposing with another invention "Pulse-Charging Type Electric Dust Collecting Apparatus" (Japanese Patent Application No. 51-073004 filed on June 21, 1976; U.S. patent application Ser. No. 807240 filed on July 16, 1977; British Pat. No. 1582194 granted on June 15, 1977; German Patent Application No. P-2727858.6-Offenlegungsschrift No. 2727858 dated on Dec. 29, 1977; French Patent Application No. 77-19022 filed on June 21, 1977) a "Pulse-Charging" of an electrostatic precipitator in which a dc high voltage is applied between the discharge and collecting electrodes of the precipitator with a particular construction not described here in detail, and pulse high voltages are applied therebetween on top of the dc high voltage in a superimposed fashion. The inventor of the present invention also succeeded in greatly improving the charging performance of a conventional dust precharging device using dc corona discharge by proposing a novel type of precharger called "Boxer-Charger" with another invention "Device for Electrically Charging Particles" (Japanese Patent Application No. 52-150937 filed on Dec. 5, 1975; U.S. Pat. No. 4,210,949 granted on July 1, 1980; UK Patent GB No. 2012493B granted on Feb. 24, 1982; German Patent Application No. P-2838688.1 filed on Sept. 5, 1978; French Pat. No. 7825125 granted on July 20, 1981) and also another invention "Particle Charging Device (Z)" (Japanese Patent Application No. 54-158852 filed on Dec. 7, 1979). The Boxer Charger of these inventions charges dust particles in an ac charging field by bombardment of monopolar ions from both sides alternately, where the ac charging field is constructed by applying an ac charging voltage across a charging space between the electrode assemblies for producing plane-like plasma ion sources, facing each other at a certain distance and insulated from each other, the said electrode assemblies consisting of a plurarity of corona electrodes for producing plane-like plasma ion source, and the pulse high voltages are applied between the said corona electrodes of each electrode assembly at a certain instant when the said electrode assembly takes a predetermined polarity of the said ac charging voltage to produce corona discharges as the plasma ion sources, and the monopolar ions of the predetermined polarity (e.g. negative polarity) are extracted by the ac charging field to be emitted into the charging space alternately from the electrode assemblies of both sides to traverse back and forth across the said charging space, and thereby to bombard the dust particles entering into the said charging space. The inventor of the present invention further succeeded in improving the performance of an ozonizer by proposing with another invention "Ozone Generating Apparatus" (Japanese Patent Application No. 021878 filed on Feb. 23, 1980) a novel type of an ozonizer which comprises plurarity of discharge electrodes attached on one surface of a solid dielectric plate and an induction electrode attached on the opposite surface of the said dielectric plate, and produces ozone by applying pulse voltages between the discharge and collecting electrodes.

The inventor of the present invention confirmed in all of the above applications that, in order to get the highest performance with the lowest energy consumption, it is necessary to use extremely short pulse high voltages with a pulse duration time of several to several hundreds nanoseconds. The conventional pulse power supply for generating such extremely short pulse high voltages has been the type as illustrated by a circuit diagram of FIG. 1. In this figure, 1 is a dc high voltage source, and its output voltage, V, is supplied via the wires 2, 3 and a current limiting resistance 4 to a pulse forming unit 5 so that it is charged. Here, the pulse forming unit 5 is a capacitive energy storage element for producing the pulse high voltage wave form, such as a high voltage condenser, a high voltage cable, or a L-C delay circuit consisting of a plurality of inductance elements and condensers in a ladder type connection. 6 is a high speed switching unit; 7 and 8 are connecting wires; 9 is a high voltage coaxial cable transmitting the generated pulse high voltage to the load 12 via the terminals 10 and 11. The high speed switching unit 6 used for generating the said extremely short pulse high voltage is generally a spark switch comprising the electrodes 13 and 14 spaced at a suitable gap distance and contained in a vessel filled with a suitable kind of insulating gas at a suitable pressure. Either a hydrogen thyratron or a high speed thyrister can also be used for the high speed switching unit 6. We take for example a spark switch as the high speed switching unit 6, and assume that its spark voltage, Vs, is set at a value lower than the output voltage of the said dc high voltage source, V, by adjusting the gap distance of the said spark spark switch 6. Then, sparking occurs between the electrodes 13 and 14 at an instant when the voltage across the capacitive energy storage element 5, v, arrived at Vs during its charging process, and the said electrodes are instantaneously short-circuited. The electric charge stored in the element 5 is discharged via the wires 7, 8 and the spark gap 6 through the input impedance (surge impedance) of the high voltage coaxial cable 9 to produce a very fast-rising extremely short pulse high voltage, $v_p$, at the input of the said cable 9. This pulse voltage proceeds along the cable 9 to the right in a form of a travelling pulse voltage, and applied via the terminals 10 and 12 across the load 12. The spark switch as described above is called "self-triggering type". Whereas the so-called "externally-triggered type" spark switches are also used for the same purpose, such as the spark switch in which its spark voltage, Vs, is set at Vs V and sparking is triggered by applying a particular pulse high voltage between the electrodes 13 and 14 in series to the original gap voltage, V, or the spark switch comprising the third triggering electrode in the gap region between the electrodes 13 and 14 and triggering the spark by applying a triggering pulse high voltage to the said third triggering electrode.

Irrespective of the triggering mechanisms, either self-triggering type or externally-triggering type, the conventional pulse power supply as illustrated in FIG. 1 for generating the extremely short pulse high voltage had the following inherent large disadvantage which greatly reduces the power efficiency of this power supply and produces a large power loss, and thereby makes its use in the various applications as already described almost prohibitive. Namely, in the charging process of the pulse forming unit 5, the full output voltage of the said dc high voltage 1, V, is applied to a series circuit of the current limiting resistance 4 and the pulse forming unit 5, so that the resistance 4 consumes a Joule energy loss in the charging process equal to the energy to be stored in the electrostatic capacity, C, of the pulse forming unit 5, i.e. $(\frac{1}{2})CV^2$, and thereby produces a very large energy loss as described above.

The purpose of the present invention is to provide an economical and highly efficient pulse power supply for generating extremely short pulse high voltages by overcoming the above disadvantage.

SUMMARY OF THE INVENTION

The present invention attains this purpose by removing the said current limiting resistance 4, and using an ac charging high voltage source instead of the dc charging high voltage source 1 in such a way that its output ac high voltage is supplied via a rectifier to the pulse forming unit 5 to charge this unit from zero voltage to the peak voltage of the said ac charging high voltage source, Vm, and thereby enabling the power loss in the charging process to remain extremely small, and by using as the said high speed switching unit 6 an externally-controlled high speed synchronous switching unit capable of being triggered externally at a predetermined period in synchronous to the said ac charging high voltage in such a way that this switching unit is triggered at a predetermined instant during the next half cycle of the ac charging high voltage when the polarity of the said ac charging high voltage is reversed after charging the said pulse forming unit 5 and the said rectifier is blocking the discharge of the pulse forming unit 5 and interrupting the connection between the unit 5 and the ac charging high voltage source 1, and thereby discharging the electric charge stored in the unit 5 through the said switching unit 6 across the load directly or through a trasmission cable so as to produce the said extremely short pulse high voltage across the load.

The characteristic construction of the present invention as described above results in the great advantages as follow: (1) The power loss in the charging cycle of the pulse forming unit 5 is greatly diminished as already described; (2) The flow of an ac short-circuit current, which otherwise follows the switching action of the high speed switching unit 6, supplied directly from the said ac charging high voltage source to the load, is completely avoided by the blocking action of the said rectifier appearing in the switching period as the switching action is made in the cycle of the said ac high voltage when its polarity has been reversed, so that the stable production of the said extremely short pulse high voltages at the output terminals of this pulse power supply is secured. As a result, the pulse power supply according to the present invention is possible to generate the said extremely short pulse high voltage with a very high efficiency and stability in spite of its very simple and economical construction.

In other words, the pulse power supply for generating extremely short pulse high voltages according to the present invention is characterized by comprising an ac charging high voltage source, a pulse forming unit consisting of a capacitive energy storage element and connected thereto through a rectifier, and an externally-controlled high speed synchronous switching unit for connecting one terminal of the said pulse forming unit to one terminal of a load, directly or through a pulse transmission line, another terminal of the said pulse forming unit being connected to another terminal of the said load, directly or through the said pulse transmission line, and further characterized by that the said pulse forming unit is charged by the said ac charging high voltage source through the said rectifier during the half cycle of the said voltage source, and that the said charged pulse forming unit is connected to the said load at a predetermined instant of the next high cycle of the said voltage source by the said externally-controlled high speed synchronous swithing unit being actuated externally in synchronous to the said voltage source, so that the charge stored in the said pulse forming unit in the charging cycle is discharged at this switching instant through the said load, directly or via the said pulse transmission line, and extremely short pulse high voltages are generated across the said load.

The said externally-controlled high speed synchronous switch means a high speed switch in general which can be actuated from outside to produce its switching action in synchronous to the said ac charging high voltage at a predetermined instant of its half cycle in the inverse polarity when the said rectifier is blocking, and any type of switch having such function can be used for this purpose irrespective of its construction. One of such switches can be for example a spark switch of pulse-trigger type comprising a pulse transformer connected in series to or in parallel to the ordinary spark gap, and its sparking is triggered externally by supplying a triggering pulse voltage from this pulse transformer in superposition on the original charging voltage of the pulse forming unit, Vm, existing across the said spark gap. Another example of such switches is a spark switch of three electrode type comprising a spark triggering third electrode in a inter-gap region, and its sparking is triggered externally by applying a triggering pulse voltage across the said third electrode and one of the main spark electrodes. Another example of such switch is a spark switch of laser-triggering type in which sparking is triggered by irradiation of a laser beam at a predetermined instant on a region in the spark gap or on one of the spark electrodes. A hydrogen thyratron, a high speed thyristor, or a high speed transistor can also be used for this purpose. Another preferable example of such externally-triggered high speed synchronous switches is a synchronous mechanical spark switch of rotating type in which one of the main spark electrodes 13, 14 consists of a suitable number of spark electrode elements attached on a rotor rotating in synchronous to the said ac charging high voltage at a synchronous speed corresponding to its frequency and the number of the spark electrode elements so as to produce the meeting of the stationary spark electrode and one of the rotating spark electrode elements successively at a desired instant in synchronous to the said ac charging high voltage so that the synchronous actions of switch-on and switch-off of the spark electrodes 13 and 14 are mechanically ensured. Another preferable example of such switches is a modified synchronous mechanical spark switch of rotating type comprising a suitable number of separate spark electrode elements attached on a rotor located in a gap region between the two spark electrodes 13 and 14 or in a region close thereto and rotating in synchronous to the said ac charging high voltage at a synchronous speed corresponding to its frequncy and the number of the said separate spark electrode elements so as to produce the synchronous switch-on and switch-off actions of the spark switch at a desired instant in synchronous to the said ac charging high voltage. Another example of such switches is a synchronous mechanical spark switch of vibrating type in which at least one of the two spark electrodes 13 and 14 makes a vibrating motion in a form of a linear vibration or rotationary vibration relative to the other one of the spark electrodes in synchronous to the said ac charging high voltage so as to produce the meeting of both spark electrodes periodically at a desired instant in synchronous to the said ac charging high voltage so that the synchronous actions of switch-on and switch-off of the spark electrodes 13 and 14 are also mechanically ensured. There are innumerable number of the synchronous mechanical spark switches of the similar kind, either rotating or vibrating type, based on the same concept, and any one of these switches can be used in the present invention irrespective of its detailed design or construction.

Common to all types of the externally-controlled high speed synchronous spark switches cited above, it is possible to locate the spark electrodes inside a closed vessel filled with a suitable insulating gas medium, such as air, hydrogen, nitrogen, or any kind of electronegative gas such as $SF_6$, either pressurized or not pressurized. This enables the reduction of spark gap to withstand sparking, and also increase of switching speed.

In the use of the said synchronous mechanical spark switch of rotating type, it is possible to use for driving the said rotor a synchronous motor having a correct rotating speed corresponding to the frequency of the said ac charging high voltage and the number of the said spark electrode elements in such a way that the said synchronous motor is connected to an ac voltage source having the same frequency as that of the said ac charging high voltage source through a phase shifter so that the phase of the rotation of the said synchronous motor can be adjusted by this phase shifter, and the sparking instant of the said synchronous mechanical spark switch of rotating type can be thereby freely adjusted. Similarly, in the use of the said synchronous mechanical spark switch of vibrating type, it is possible for generating the said vibration to use either a synchronous motor with a suitable mechanism of converting its rotating motion to a vibrating motion, an electromagnetic vibrator, or a rotating vibrator having an eccentric rotor driven by a synchronous motor, in such a way that either the said driving synchronous motor or the said electromagnet is connected to the ac voltage source having the same frequency as that of the said ac charging high voltage through a phase shifter so that the phase of the vibrating motion of the spark electrode can be adjusted by this phase shifter, and the sparking instant of the said synchronous mechanical spark switch of vibrating type can be freely adjusted.

Regarding the material of the said spark electrodes to be used in any type of the said externally-controlled high speed synchronous switch, it is possible to use any kind of suitable electrode material indicating least erosion by sparking, in particular brass, copper, tungsten, sinter-alloies of these metals, or graphite electrode sintered at a very high temperature.

The change in the sparking characteristics of the said spark switch caused by erosion of the electrode material can be avoided in the following ways: (1) the spark electrodes, including the third electrode in the said spark switch of three electrode type and the spark electrode elements or the separate spark electrode elements of the said synchronous mechanical spark switch of either rotating or vibrating type, are constructed in a form of parallel elongated electrode elements facing each other, such as the parallel rod electrodes, parallel plane electrodes, concentric cylinder electrodes, or the like, so that the original gap length can be maintained for a very long time at some areas of the electrodes even after a long period of erosion, and the sparking characteristics can remain unaltered.; (2) The spark electrodes are constructed in a form of elongated rods or wires, facing each other at one end of each electrode, and being pushed manually or automatically so as to keep the electrode gap constant to overcome the enlagement of the gap due to spark erosion so that the sparking characteristics can be maintained unchanged.; (3) The manual or automatic control mechanism for moving the spark electrode(s) to compensate the change of the spark gap is added to the spark electrodes described in (1).

The automatic control of the gap length can be performed in such a way that the sparking voltage of the gap, Vs, is detected to be fed back to an actuator, such as a servo-motor, which moves the spark electrode(s) or its carrier, or the rod or wire electrode(s) so that the said sparking voltage of the gap, Vs, is kept constant at a predetermined level.

For the said pulse forming unit 5 to be used in the present invention, it is possible to utilize any suitable kind of capacitive energy storage element, such as a condenser, coaxial cable, a L-C delay circuit consisting of plurarity of inductance elements and condensers in a ladder type connection. In particular, in the case when condenser(s) is used, it is preferable to use a low-inductance type condenser, or a ceramic condenser. In the case when condenser(s) is used for the pulse forming unit 5, it is possible to use plurarity of condensers in combination with rectifiers to construct a Marx-circuit in which the condensers are charged in parallel, and discharged in series connection so as to provide a multiple of the condenser voltage at the output of this Marx-circuit.

BRIEF DESCRIPTION OF THE DRAWINGS

In the following are explained in more detail the construction and features of the novel pulse power supply for generating extremely short pulse high voltage according to the present invention, with the aid of examples of embodiment and drawings.

DESCRIPTION OF THE PREFERRED EMBODIMENTS

Figure 1:
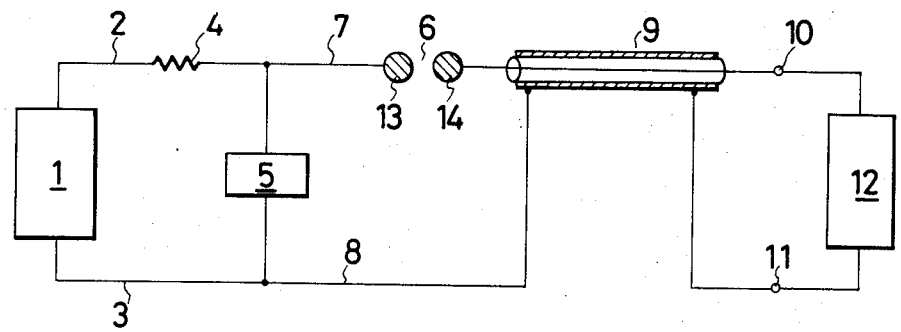
FIG. 1 is a circuit diagram of a prior art pulse power supply.
Figure 2:
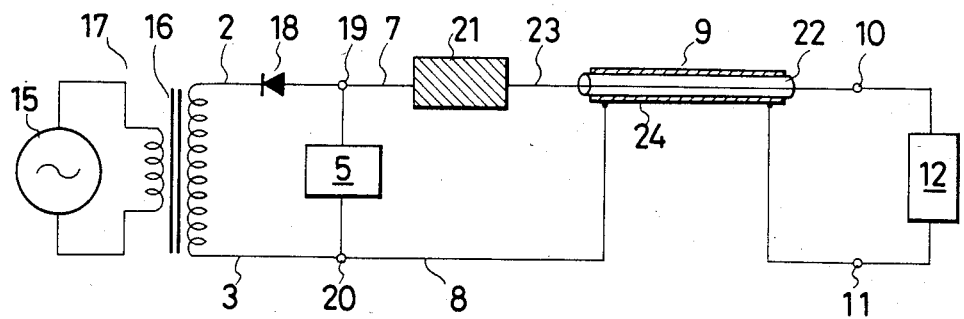
FIG. 2 indicates a circuit diagram showing the basic construction of the pulse power supply for generating extremely short pulse high voltages according to the present invention.

FIG. 2 indicates a circuit diagram showing the basic principle of the present invention. The ac charging high voltage source 17 consists of a primary ac voltage source 15 and a step-up transformer 16, and its output ac charging high voltage is supplied to the terminals 19 and 20 of the high voltage pulse forming unit 5 through the connecting wires 2, 3 and a rectifier 18. The pulse forming unit 5 is charged up to the peak value of the said ac charging high voltage, ($-Vm$), during its negative half cycle in this particular case when the rectifier 18 is inserted in a direction as indicated in this figure. As this charging process proceeds in such a way that the charging voltage alters from zero to the said peak voltage, the power loss appearing at the resistance part of the circuit is very small. The element 21 represents the said externally-controlled high speed synchronous switching unit connected between one of the terminals 19 of the said pulse forming unit 5 and a core wire 22 of a coaxial cable 9. This switching unit 21 is maintained in a off-condition during the entire negative half cycle of the said ac charging high voltage when the pulse forming unit 5 is charged up, and also during a part of its next positive half cycle until a desired instant when the switch-on action of the said switch 21 is actuated externally. As a result the voltage across the pulse forming unit 5 is maintained at ($-Vm$) even after the polarity of the said ac charging high voltage is reversed to positive by the blocking action of the rectifier 18, until the said switch-on instant. Then, at a predetermined instant during the positive half cycle of the said ac charging high voltage when the rectifier 18 is in a blocking action, the switch-on action of the said externally-controlled high speed synchronous switching unit 21 is actuated externally. The terminal voltage of the pulse forming unit 5 is applied to the input of the high voltage cable for pulse transmission 9 across its core wire 22 and its outer conductor 24, through the connecting wires 7, 8, the said externally-controlled high speed synchronous switching unit 9, and a connecting wire 23. The electric charge stored in the said pulse forming unit 5 is, then, discharged across the input impedance (surge impedance), Zo, of the said coaxial cable 9 to produce an extremely short pulse high voltage at its left end, the wave form and magnitude of which are determined by the characteristic properties of the said pulse forming unit 5 (such as the capacity of the condenser; the values of the distributed capacity and inductance as well as the total length of a cable or a L-C delay circuit) and the magnitude of Zo. This pulse high voltage proceeds in a form of a travelling wave along the cable 9 to the right, to appear at its output terminals 10 and 11 and to be applied across the load 12. When the impedance of the load 12, $Z_L$, is made equal to the surge impedance of the cable 9, Zo, i.e. $Z_L = Zo$, then, the reflection of the pulse voltage wave at the load can be avoided, so that all the energy contained in the pulse voltage wave is consumed by the load 12, and the energy supply efficiency to the load can be improved.

As described above, in the present invention, the charging of the pulse forming unit 5 is made by an ac charging high voltage which alters its charging voltage from zero to its peak value during the charging process, so that it produces very small charging power loss which can become very large in the case when the pulse forming unit 5 is charged by a dc charging voltage source. In addition, the use of the rectifier 18 completely avoids the short-circuit current to flow directly from the said ac charging high voltage source 17 into the load 12 when the switching unit 21 becomes on.

Figure 3:
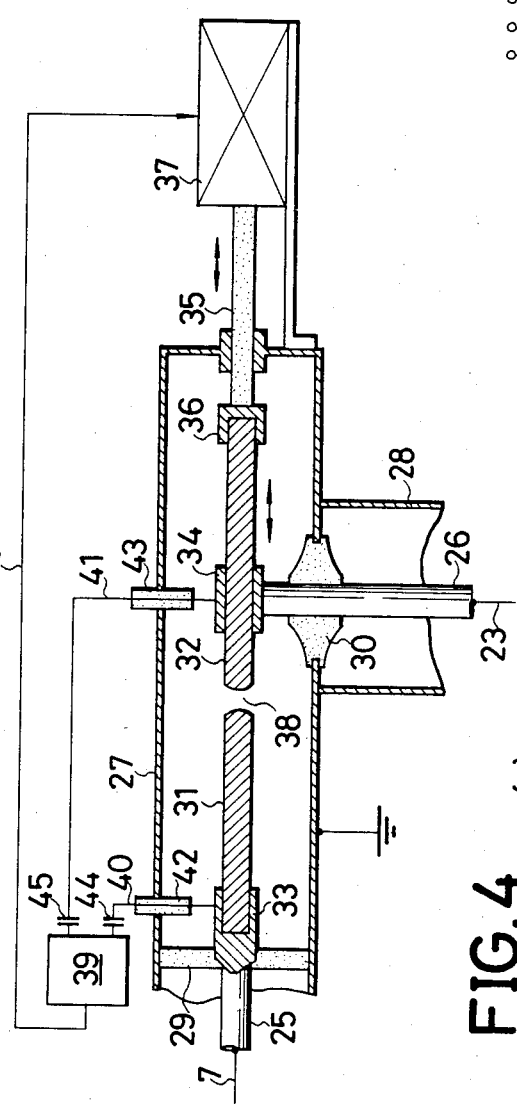
FIGS. 3 and 4 indicate respectively the cross-sections of two examples of the externally-controlled high speed synchronous switching units used in the present invention.

FIG. 3 illustrates one of the embodiments of the externally-controlled high speed synchronous switching unit to be used in the present invention. The elements 25 and 26 represent the rod conductors connected to the wires 7 and 23 as shown in FIG. 2 respectively, and are contained in the inside of the grounded conductor casings 27 and 28 respectively which are serving as the connecting wire 8 in FIG. 2. The elements 29 and 30 are the insulators supporting the said rod conductors 25 and 26 respectively. The elements 31 and 32 are the rod spark electrodes supported by the electrode supporting members 33 and 34 respectively and consisting of the material which is resistant to the spark erosion. The said electrode supporting member 34 is supporting the rod spark electrode 32 in such a manner that the rod electrode 32 can be freely moved sliding through the supporting member 34. Further, the said rod spark electrode 32 is fixed at its right end to a supporting member 36 which is fixed on the end of an insulating rod 35 passing through the bottom part of the casing 27, and can be moved back and forth by the movement of the insulating rod 35 driven by an automatically controlled moving device 37. As a result the length of the spark gap 38 can be adjusted automatically to maintain a constant sparking voltage. The element 39 is a pulse power supply for generating the triggering pulse voltage, and its output terminals are connected through the coupling condensers 44, 45, connecting wires 40, 41 via the bushing insulators 42, 43 to the said electrode supporting members 33 and 34 respectively. The said pulse power supply 39 provides the triggering pulse high voltage across the spark gap 38 between the rod electrodes 31 and 32 superimposed to the gap dc potential difference equal to the charged voltage, Vm, of the pulse forming unit 5 at a desired instant during a half cycle of the said ac charging voltage in the reverse polarity when the rectifier 18 is in the blocking condition, so that the sparking is triggered across the gap 38 to produce the switch-on condition therein. When the rod spark electrodes 31 and 32 were eroded by sparkings to make the length of the spark gap 38 too long so as not produce the sparking, the triggering pulse current supplied from the pulse power supply 39 becomes greatly reduced. This is detected in the said power supply 39 to produce a control signal which is fed via a wire 46 to the said automatically controlled moving device 37 to actuate its motion to move the rod spark electrode 32 towards the left to reduce the gap length. This moving action is stopped as soon as the sparking began to occur at the gap 38.

Figure 4:
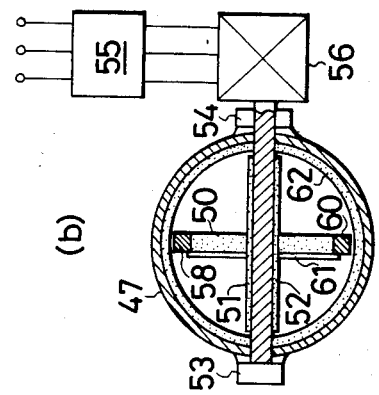
Figure 4:
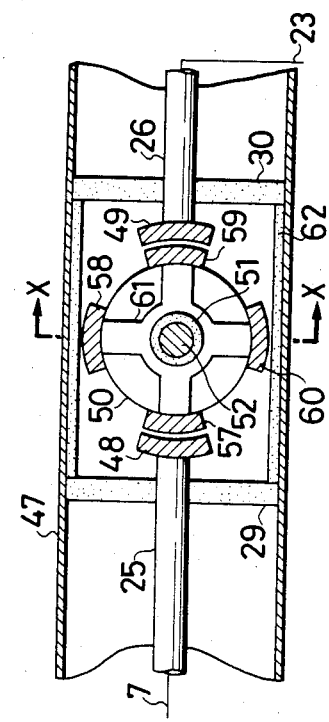

FIG. 4 illustrates another embodiment of the externally-controlled high speed synchronous switching unit to be used in the present invention, which is one of the examples of the synchronous mechanical spark switch of rotating type. FIG. 4(a) indicates its cross-sectional view along the axis of the grounded cylindrical conductor casing 47, and FIG. 4(b) indicates its another cross-sectional view along the cross-section X-X perpendicular to the said cylinder axis. The rod conductors 25 and 26 are located along the said axis of the cylindrical casing 47, supported by the insulating supporting members 29 and 30 respectively, and connected to the wires 7 and 23 as shown in FIG. 2, respectively. The rod conductors 25 and 26 are supporting the arc-shaped spark electrode shoes 48 and 49, respectively. The element 50 is an insulating rotor disc fixed on a rotating metal shaft 52 with an insulating cylindrical collar 51 fixed around it. The shaft 52 is supported by two bearings 53 and 54 at the outside of the casing 47, and is coupled to the synchronous motor 56 which is connected to via a phase shifter 55 the same ac voltage source as that providing the primary ac voltage source 15 of the ac charging high voltage source 17 as shown in FIG. 2. The elements 57, 58, 59 and 60 are the arc-shaped spark electrode shoes attached on the perifery of the said insulating rotor disc 50 with 90° angle from each other, and the outer end of each shoe faces the stationary shoes 48 and 49 at a small spark gap when it comes to the closest meeting position thereto. These shoes 57 to 60 are connected to each other with a cross-shaped conductor element 61 attached on the said disc 50. The member 62 is an insulating cylindrical wall attached to the inner wall of the grounded cylinderical conductor casing 47 in such a way that it surrounds the said rotor disc 50 so as to insulate the spark electrode shoes 57 to 60 from the said cylindrical conductor casing 47. In this particular case of FIG. 4 where there are 4 spark electrode shoes attached on the rotor disc 50, the rotating speed of the said synchronous moto 56 at the frequency, f, of the said ac charging high voltage should be (f/4) revolutions per second. Then, the spark electrode shoes 57, 58, 59 and 60 on the rotor disc 50 come successively to the meeting points in front of the stationary spark electrode shoes 48 and 49 at the desired instant of switching determined by the adjustment of the phase shifter 55 in the half cycle of the said ac charging high voltage when its polarity was reversed after the charging of the pulse forming unit 5, and the rectifier is in a blocking condition. The sparking occurs at this instant between the rotating and stationary spark electrode shoes, leading to an electrical connection of the spark electrode shoes 48 and 49 via the cross-shaped conductor element 61. In the next half cycle of the ac charging high voltage when its polarity is further reversed to that the rectifier 18 is now being conducting, the stationary spark electrode shoes 48 and 49 are facing to the intermediate regions between the rotating spark electrode shoes 57 and 60, and 59 and 58, or 60 and 59, and 58 and 57, so that no sparking can take place because of a much longer gap length and the two spark electrode shoes are kept separated from each other. It is possible in this switching unit to remove the insulating rotor disc 50 and to use only the cross-shaped conductor element 61.

Figure 5:
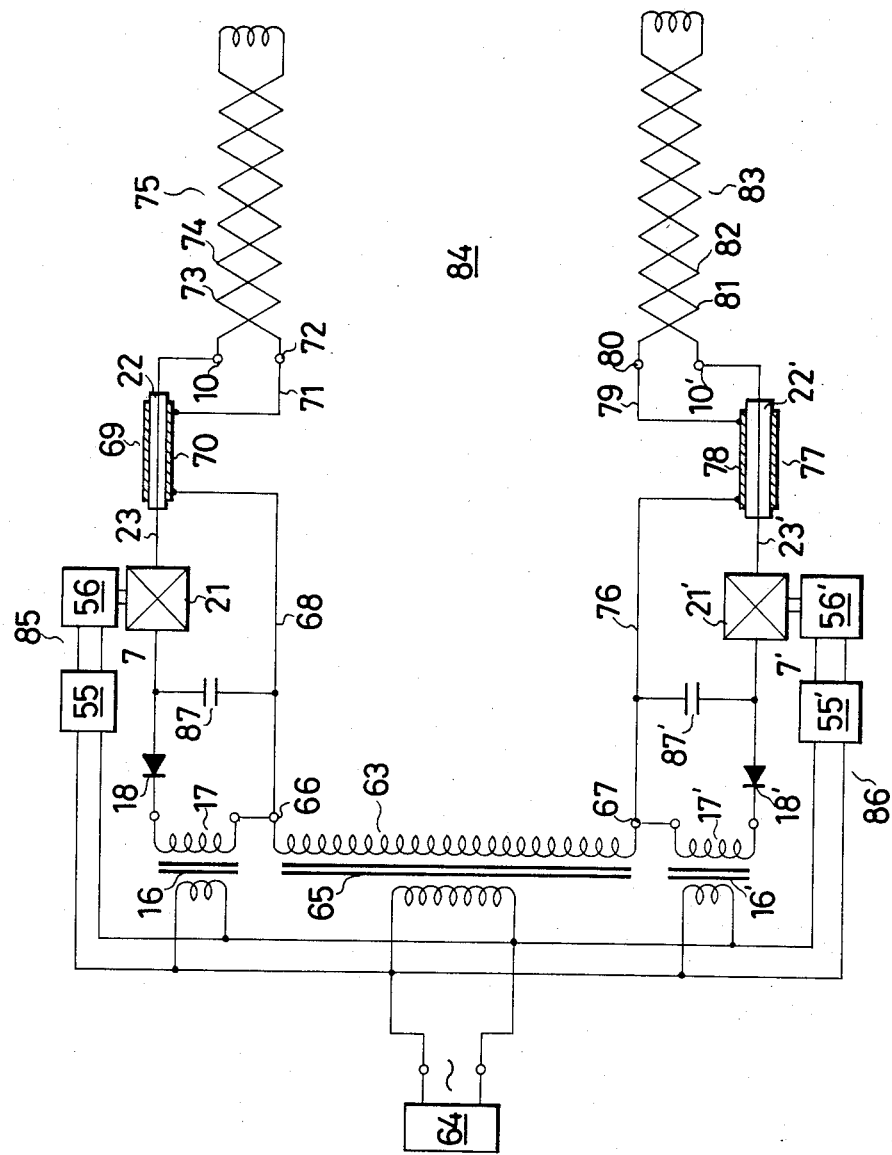
FIG. 5 illustrates a circuit diagram of the power supply for operating a dust charging apparatus "Boxer-Charger" which uses the pulse power supplies for generating the extremely short pulse high voltages according to the present invention.

FIG. 5 illustrates an example of the pulse power supply for generating extremely short pulse high voltages according to the present invention as applied in the power supply for operating a particle charging device "Boxer-Charger". In this figure, the element 63 is an ac charging high voltage source consisting of an ac low voltage source 64 and a step-up transformer 65, the secondary terminals 66 and 67 of which are connected to the electrode assemblies 76 and 83 of Boxer-Charger respectively, each consisting of double helical electrodes 73, 74 and 81, 82, through a wire 68, the outer conductor 70 of a coaxial cable 69, a wire 71, a terminal 72, and a wire 76, the outer conductor 78 of a coaxial cable 77, a wire 79, a wire 80 respectively. Thus, the ac charging high voltage source 63 supplies its output ac charging high voltage to the said electrode assemblies 75 and 83 constituting the Boxer-Charger to produce an ac charging field therebetween. The elements 85 and 86 are the pulse power supplies for generating extremely short pulse high voltages according to the present invention to provide, respectively, an extremely short pulse high voltage alternately to the said electrode assembly 75 across its double helix electrodes 73 and 74, and the electrode assembly 83 across its double helix electrodes 81 and 82, at an instant when each electrode assembly takes a voltage of the said ac charging high voltage source 63 immediately before its peak voltage of a predetermined polarity, i.e. negative polarity in this case. The said pulse power supplies 85 and 86 comprise, respectively, the ac charging high voltages 17 and 17' consisting of an ac low voltage source 64 common to that of the said ac charging high voltage source 63 and the step-up transformers 16 and 16' respectively, the rectifiers 18 and 18' respectively, the condensers 87 and 87' as the said pulse forming units, and the said externally-controlled high speed synchronous switching units 21 and 21', respectively, each consisting of a synchronous mechanical spark switch of rotary type as shown in FIG. 4, and finally the other connecting wires 7, 7', 23, 23', 22, 22', as indicated in FIG. 2. The elements 55 and 55' are the said phase shifters, and the elements 56 and 56' are the single-phase synchronous motors to drive the rotor discs of the said switching units 21 and 21' respectively. Each of the said pulse power supplies 85 and 86 is in the charging period when its corresponding electrode assembly 75 or 83 is in the positive polarity of the ac charging voltage from the said ac charging high voltage source 63, so that its corresponding switching unit 21 or 21' is in the switch-off condition and its corresponding rectifier 18 or 18' is in the conducting condition so as to electrically charge up its corresponding condensers 87 or 87'. Then each of the said pulse power supplies 85 and 86 produces the said extremely short pulse high voltage in the next half cycle of the said ac charging high voltage from the source 63 when its corresponding electrode assembly 75 or 83 is in the negative polarity of the said ac charging high voltage, at a predetermined instant immediately before its negative peak voltage, owing to the switch-on action of its corresponding switching unit 21 or 21' as explained in detail. The said extremely short pulse high voltage, thus produced, is applied via the said coaxial cable 69 or 77 across the said double helix electrodes 73 and 74, or 81 and 82 of the electrode assembly 75 or 83, to produce a travelling pulse high voltage proceeding along the transmission line consisting of the helix electrodes 73-74 of the electrode assembly 75 or the transmission line of the helix electrodes 81-82 of the electrode assembly 83 at the said instant of switch-on immediately before the negative peak voltage of the corresponding electrode assembly, and, thereby to produce a series of very active streamer coronas as an active plasma ion source along the entire length of the double helix electrodes 73-74 or 81-82. Hence, when the electrode assembly 75 is at a negative voltage of the said ac charging voltage from the source 63 immediately before its negative peak voltage, and the said plasma ion source is produced along its double helix electrodes 73-74, the monopolar ions of negative ions only are extracted from this plasma ion source by the said charging field formed between the electrode assemblies 75 and 83, and travel across the charging space 84 to the opposite electrode assembly 83, which does not produce the plasma ion source in this cycle, to be collected thereon. In the next half cycle of the said ac charging high voltage from the source 63 when the electrode assembly 83 is now in its negative polarity, the said plasma ion source is produced at the predetermined instant immediately before the negative peak voltage along its double helix electrodes 81-82, so that the monopolar ions of negative polarity start now from this plasma to travel across the charging space 84 in the opposite direction towards the electrode assembly 75, now being at rest, to be collected thereon. As a result, the negative ions are travelling back and forth across the charging space 84, and the dust particles entering therein are bombarded by these ions from both sides alternately to be quickly charged negatively.

Figure 6:
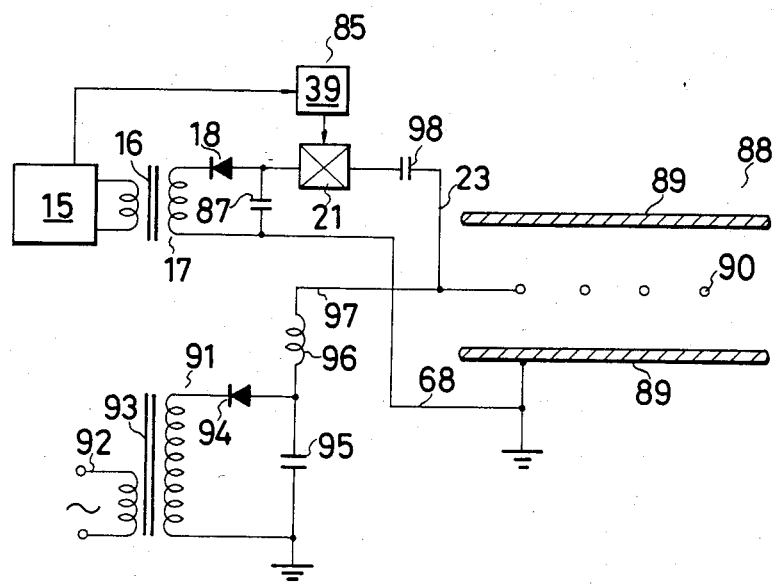
FIG. 6 indicates a circuit diagram of a power supply for pulse-energization of an electrostatic precipitator of twin-electrode type, which uses the pulse power supply for generating the extremely short pulse high voltages according to the present invention.

FIG. 6 illustrates the application of the pulse power supply for generating extremely short pulse high voltages according to the present invention in the pulse-energization of an electrostatic precipitator of twin-electrode type comprizing discharge and collecting electrodes. The element 88 in the figure represents a duct of the collection field of the said electrostatic precipitator, comprising the grounded collecting electrodes 89 and the discharge electrodes 90 located therebetween and insulated therefrom. The element 91 is a negative dc-high voltage power supply consisting of an ac low voltage source 92, step-up transformer 93, rectifier 94, and a smoothing condenser 95, and supplies a negative dc high voltage to the said discharge electrodes 90 through a choke coil 96 blocking the penetration of the extremely short pulse high voltage and a connecting wire 97. The element 85 is the pulse power supply for generating extremely short pulse high voltages according to the present invention, which comprizes an ac charging high voltage source 17 consisting of an ac low voltage source 15 with the same frequency as the desired pulse frequency and a step-up transformer 16, a rectifier 18, and a condenser 87 for forming the high voltage pulse wave form, all these elements being connected as shown in FIG. 2, and also consists of the externally-controlled high speed synchronous switching unit 21 comprising a triggering pulse voltage source 39 as shown in FIG. 3. The explanation of this pulse power supply 85 is omitted as it was already described in detail. The output extremely short pulse high voltages from the pulse power supply 85 is supplied through a coupling condenser 98, connecting wires 23 and 68 to the gap between the discharge electrodes 90 and collecting electrodes 89, superimposed on the said dc high voltage existing therebetween. These extremely short pulse high voltages proceeds in a form of travelling waves along the transmission line consisting of the discharge electrodes and collecting electrodes, producing very active negative coronas along the entire length of the discharge electrodes, and thereby enhance greatly the electrical charging of dust particles, and, hence, the collection performance of the precipitator as well.

Figure 7:
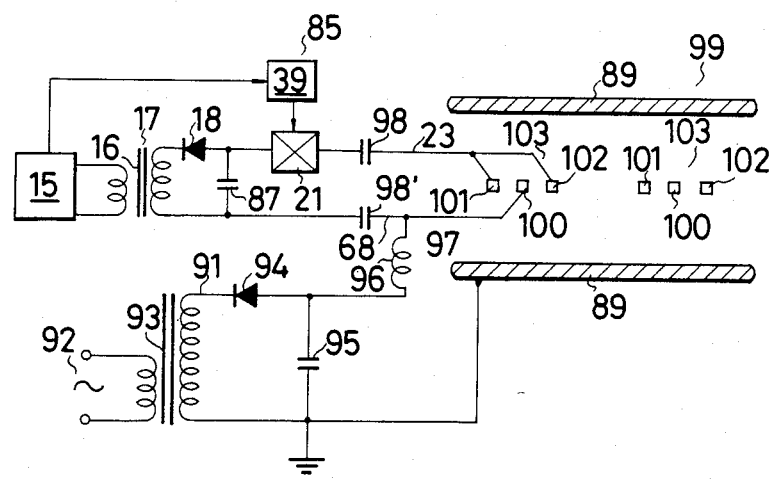
FIG. 7 indicates a circuit diagram of a power supply for pulse-energization of an electrostatic precipitator of tri-electrode type, which uses the pulse power supply for generating the extremely short pulse high voltages according to the present invention.

FIG. 7 illustrates the application of the pulse power supply for generating extremely short pulse high voltages according to the present invention in the pulse-energization of an electrostatic precipitator of tri-electrode system comprizing the discharge and collecting electrodes as well as the third electrodes located close to the said discharge electrode, insulated therefrom. The element 99 represents a duct of the collection field of the said electrostatic precipitator comprising the grounded collecting electrodes 89, the third electrodes 100 located therebetween and insulated therefrom, and the discharge electrode assemblies 103 consisting of corona electrodes 101 and 102 located at both sides of the third electrodes 100 close thereto and insulated there from and also from the collecting electrodes 89. The element 91 is a dc high voltage source consisting of the elements 92, 93, 94 and 95 as already explained in reference to FIG. 6, and supplied a nagative dc high voltage to the third electrodes 100 through the said choke coil 96 and a connecting wire 97. There exists a leakage circuit element with a high impedance, not shown in the figure, between the third electrodes 100 and the discharge electrodes 101 and 102 in parallel to the insulators therebetween, so that all these electrodes 100, 101 and 102 are at the same dc negative potential when not energized by the pulse voltages. The element 85 is the same pulse power supply as the element 85 in FIG. 6 for generating extremely short pulse high voltages, consisting of the same elements 15, 16, 17, 18, 21, 39 and 87 as those with the same numbers in FIG. 6, and its output extremely short pulse high voltages are supplied via the coupling condensers 98, 98′ and the connecting wires 23, 97 to the gap between the said third electrodes 100 and the said discharge electrodes 101, 102 in a polarity such that the discharge electrodes become negative in relation to the third electrodes. Then, the said extremely short pulse high voltage proceeds in a form of a travelling wave on the transmission lines consisting of the third electrodes 100 and the discharge electrodes 101, 102 to produce instantanuously an increase in the negative potential of the discharge electrodes 101, 102 in relation to the collecting electrodes 100, so that the said discharge electrode produce very active negative coronas towards the collecting electrodes 100. In this case, most of the energy required to produce the said active negative coronas is supplied from the dc electric field formed by the dc high voltage source 91, so that the said extremely short pulse high voltage is not subjected to a substantial decay during its travel along the said transmission lines, so that it can trigger the said active negative coronas along a long distance of the transmission lines. In this case, it is possible to use for the insulation of the said discharge electrodes 101 and 102 from the said third electrodes 100 the inductance elements, such as coils, as proposed by the inventor of the present invention in a separate invention "Electrode Apparatus to be Applied with Extremely Short Pulse Voltages" (Japanese patent application No. 55-124401 filed on Sept. 8, 1980) and "Particle Charging Apparatus" (U.S. patent application No. 246,397 filed on Mar. 23, 1981; German patent application No. P-3111986.7 and G-8108941.4 filed on Mar. 26, 1981; UK patent application No. 8109058 filed on Mar. 23, 1981 and publicated as UK patent application GB No. 2075759 A). In this case, as such an extremely short pulse high voltage contains essentially very high frequency components in a great quantity, the most of its pulse energy is reflected by the said inductance elements effectively.

Besides the applications cited above, the novel pulse power supply for generating extremely short pulse high voltages according to the present invention can also be applied in an ozonizer in such a way that the said extremely short pulse high voltages are applied on the elongated corona electrodes of the ozonizer to produce very active corona discharges, and thereby to produce ozone. In this case, when a non-corona counter electrode is placed in front of the said elongated corona electrodes, and a dc high voltage is applied therebetween, most of the energy required for producing the streamer coronas on the said corona electrodes is supplied from the said dc high voltage source so that a great economical advantage can be obtained.

The pulse power supply for generating extremely short pulse high voltage according to the present inventions can also be used any a-plications other than cited above which requires the use of the extremely short pulse high voltages.

We claim:

1. An electrostatic precipitator comprising:
   a collection duct;
   a group of grounded collecting electrodes;
   a group of discharge electrodes and a power supply for generating voltage pulses of short duration and applying the same to said electrodes comprising:
   a high voltage ac voltage source;
   an electrical energy storage device;
   a rectifier connecting said ac charging source directly to said storage device; and
   an externally-controlled high speed synchronous switching unit, said switching unit comprising:
   a first terminal connected to said storage device;
   a second terminal adapted for connection to said group of discharge electrodes;
   a spark gap disposed between said first and second terminals; and
   means for synchronously lowering the resistance of said spark gap, whereby said storage device is charged during one half cycle of said ac voltage source and during a predetermined portion of the next half cycle, said means for synchronously lowering the resistance of said spark gap lowers the resistance of said spark gap and discharges said storage device to a load.

2. The electrostatic precipitator as claimed in claim 1 wherein said first and second terminals comprise first and second opposed rod spark electrodes, respectively; means for slidably mounting one of said rod spark electrodes and thus adjusting the length of said spark gap; and said means for synchronously lowering the resistance of said spark gap comprises a trigger pulse power supply connected to said first and second rod spark electrodes.

3. The electrostatic precipitator as claimed in claim 1 wherein said first and second terminals comprise first and second opposing spark electrode shoes, respectively; and said means for synchronously lowering the resistance of said spark gap comprises a rotor mounted between said first and second electrode shoes, said rotor having at least one pair of spark electrode shoes disposed on the periphery thereof said spark electrode shoes being electrically conductive and providing a path for electrical current therebetween.

4. The electrostatic precipitator as claimed in claim 1 further comprising a synchronous motor and a source of power for said motor which includes a phase shifter, for driving said rotor synchronously with said ac voltage source and adjusting the relationship between said rotor with said ac voltage source.

5. The electrostatic precipitator as claimed in claim 1 wherein said electrodes comprise a pair of double helical electrodes in a "Box-Charger".

6. The electrostatic precipitator as claimed in claim 1 wherein said group of grounded collection electrodes and said group of discharge electrodes comprise a twin-electrode pulse energization-type electrostatic precipitator.

7. The electrostatic precipitator as claimed in claim 1 wherein said group of grounded collecting electrodes and said group of discharge electrodes comprise a tri-electrode pulse energization-type electrostatic precipitator.

* * * * *

UNITED STATES PATENT AND TRADEMARK OFFICE
CERTIFICATE OF CORRECTION

PATENT NO. : 4,541,848

DATED : September 17, 1985

INVENTOR(S) : Senichi Masuda

Page 1 of 4

It is certified that error appears in the above-identified patent and that said Letters Patent is hereby corrected as shown below:

Patent Cover Page, Line 24:

"arc" should be --ac--

Column 2, line 2:

"plurarity" should be --plurality--

Column 2, line 22:

"plurarity" should be --plurality--

Column 2, line 38:

"spark" should be omitted.

Column 2, lines 50 and 51:

"terminals 10 and 12" should be --terminals 10 and 11--

Column 3, line 42:

"trasmission" should be --transmission--

UNITED STATES PATENT AND TRADEMARK OFFICE
CERTIFICATE OF CORRECTION

PATENT NO. : 4,541,848

DATED : September 17, 1985

INVENTOR(S) : Senichi Masuda

It is certified that error appears in the above-identified patent and that said Letters Patent is hereby corrected as shown below:

Column 5, line 10:
"frequncy" should be --frequency--

Column 5, line 64:
"sinter-alloies" should be --sinter-alloys--

Column 6, line 16:
"enlagement" should be --enlargement--

Column 6, lines 34, 39:
"plurarity" should be --plurality--

Column 9, line 18:
"perifery" should be --periphery--

Column 9, line 32:
"moto" should be --motor--

Column 9, line 3:
"so" should be --to--

UNITED STATES PATENT AND TRADEMARK OFFICE
CERTIFICATE OF CORRECTION

PATENT NO. : 4,541,848

DATED : September 17, 1985

INVENTOR(S) : Senichi Masuda

It is certified that error appears in the above-identified patent and that said Letters Patent is hereby corrected as shown below:

Column 9, line 66:

"assemblies 76" should be --assemblies 75--

Column 11, lines 23, 26, 45:

"comprizing" should be --comprising--

Column 11, lines 37 and 38:

"comprizes" should be --comprises--

Column 11, line 65:

"comprizing" should be --comprising--

Column 12, line 1:

"comprizing" should be --comprising--

Column 12, line 10:

"nagative" should be --negative--

Column 12, line 32:

"instantanuously" should be --instantaneously--

UNITED STATES PATENT AND TRADEMARK OFFICE
CERTIFICATE OF CORRECTION

PATENT NO. : 4,541,848

DATED : September 17, 1985

INVENTOR(S) : Senichi Masuda

It is certified that error appears in the above-identified patent and that said Letters Patent is hereby corrected as shown below:

Column 12, line 41:
"decay" should be --delay--

Column 12, line 56:
"publicated" should be --published--

Column 13, line 10:
"any a-plications" should be --in any applications--

Signed and Sealed this

Twenty-ninth Day of April 1986

[SEAL]

Attest:

DONALD J. QUIGG

Attesting Officer

Commissioner of Patents and Trademarks